US011329029B2

(12) United States Patent
Cho

(10) Patent No.: US 11,329,029 B2
(45) Date of Patent: May 10, 2022

(54) SEMICONDUCTOR PACKAGE INCLUDING EMBEDDED SOLDER CONNECTION STRUCTURE

(71) Applicant: SK hynix Inc., Icheon-si (KR)

(72) Inventor: Sung Ho Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 1 day.

(21) Appl. No.: 16/997,623

(22) Filed: Aug. 19, 2020

(65) Prior Publication Data
US 2021/0320086 A1 Oct. 14, 2021

(30) Foreign Application Priority Data

Apr. 9, 2020 (KR) .................. 10-2020-0043654

(51) Int. Cl.
*H01L 25/065* (2006.01)
*H01L 23/00* (2006.01)
*H01L 25/00* (2006.01)

(52) U.S. Cl.
CPC .......... *H01L 25/0657* (2013.01); *H01L 24/13* (2013.01); *H01L 25/50* (2013.01); *H01L 2224/13022* (2013.01); *H01L 2224/13083* (2013.01); *H01L 2225/06513* (2013.01); *H01L 2225/06541* (2013.01); *H01L 2225/06586* (2013.01)

(58) Field of Classification Search
CPC ..... H01L 25/0657; H01L 24/13; H01L 25/50; H01L 2224/13083; H01L 2225/06513; H01L 2225/06586; H01L 2225/06541; H01L 2224/13022
See application file for complete search history.

(56) References Cited

U.S. PATENT DOCUMENTS

| 9,899,304 | B2 | 2/2018 | Imafuji et al. |
| 10,049,996 | B2 * | 8/2018 | Unruh ............... H01L 23/49816 |
| 10,056,347 | B2 | 8/2018 | Chiu et al. |
| 2006/0207086 | A1 * | 9/2006 | Saeki ...................... H01G 4/38 |
| | | | 29/830 |
| 2016/0100484 | A1 | 4/2016 | Kunieda et al. |
| 2020/0203315 | A1 * | 6/2020 | Shih ....................... H01L 24/16 |
| 2020/0402958 | A1 * | 12/2020 | Fang ..................... H01L 21/561 |
| 2021/0134761 | A1 * | 5/2021 | Oh .......................... H01L 24/12 |

FOREIGN PATENT DOCUMENTS

KR 1020140023625 A 2/2014

\* cited by examiner

*Primary Examiner* — Douglas W Owens
(74) *Attorney, Agent, or Firm* — William Park & Associates Ltd.

(57) ABSTRACT

A semiconductor package includes a first semiconductor chip including a first chip body portion and a first chip rear bump disposed in a region recessed into the first chip body portion, and a second semiconductor chip stacked on the first semiconductor chip and including a second chip body portion and a second chip front bump protruding from the second chip body portion. The first chip rear bump includes a lower metal layer and a solder layer disposed on the lower metal layer. The second chip front bump is bonded to the solder layer. The second chip front bump is disposed to cover at least the solder layer on a bonding surface of the second chip front bump and the solder layer.

18 Claims, 14 Drawing Sheets

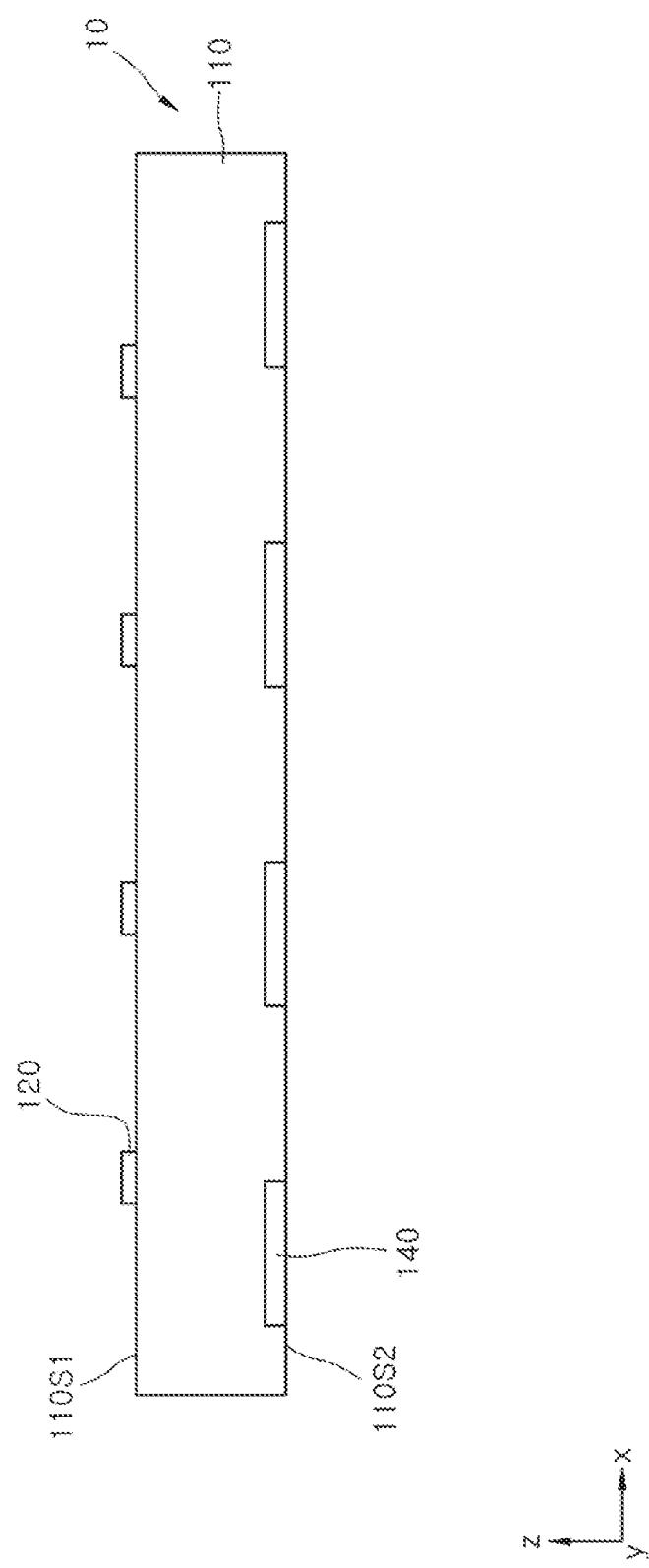

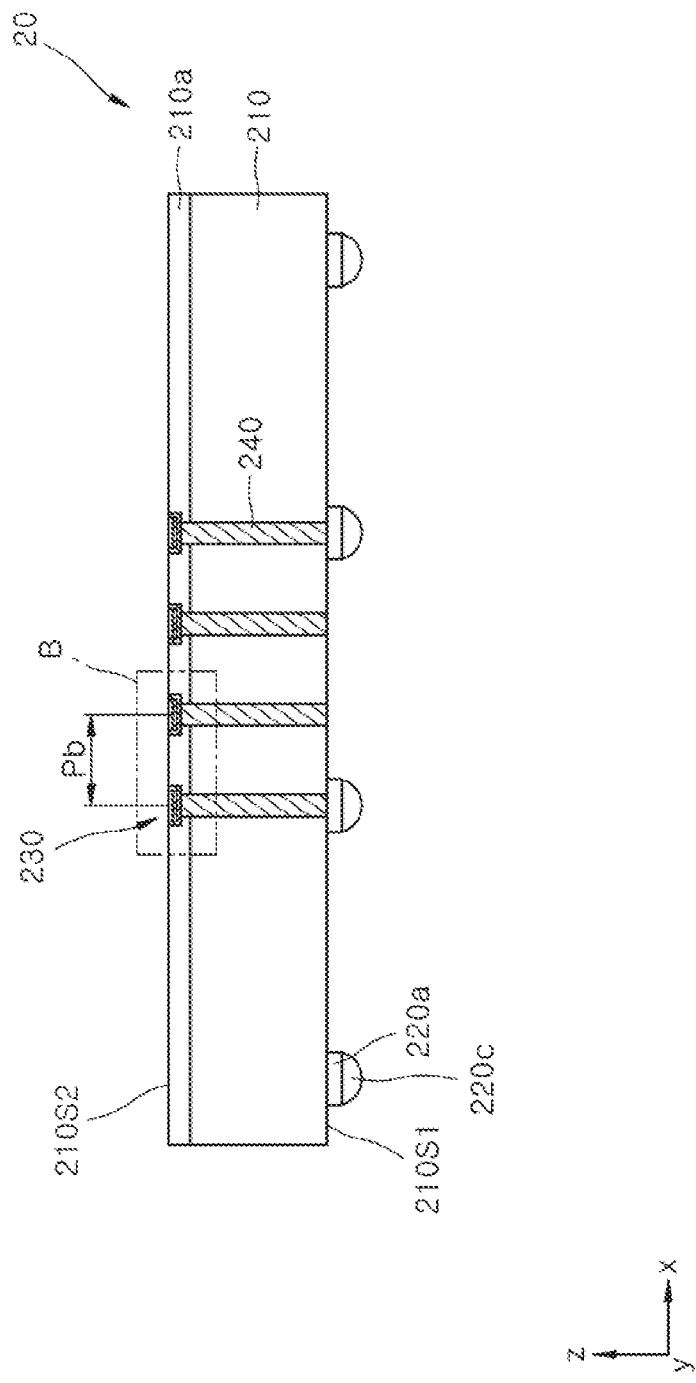

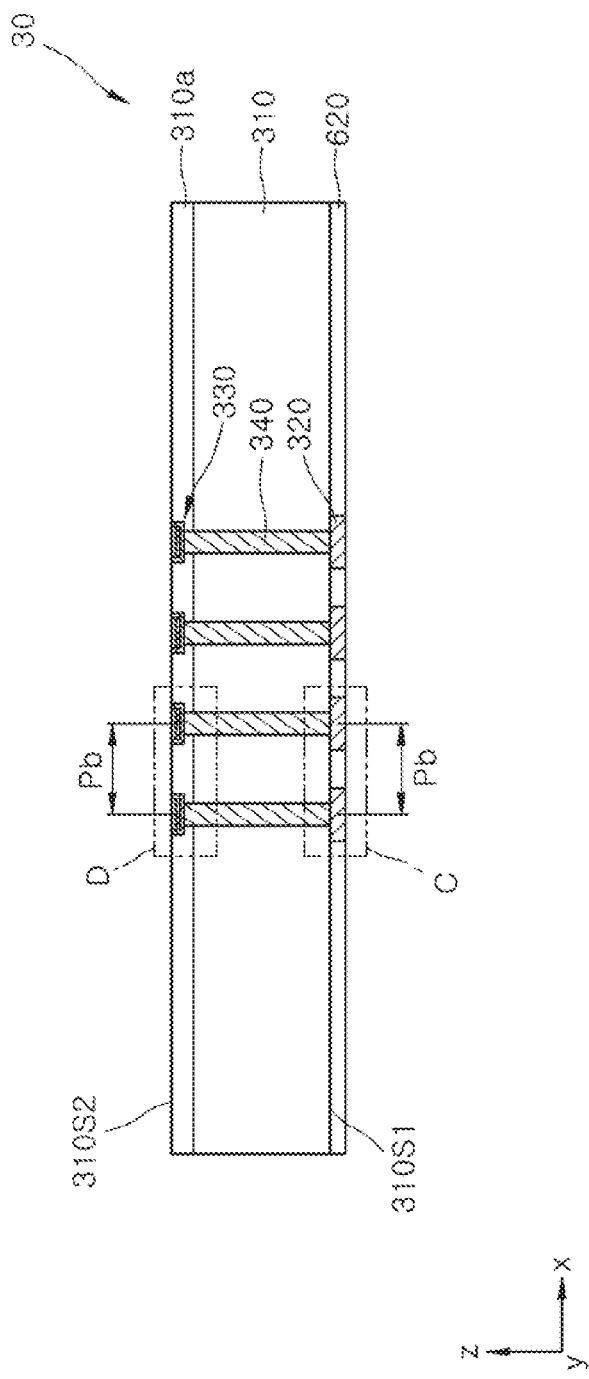

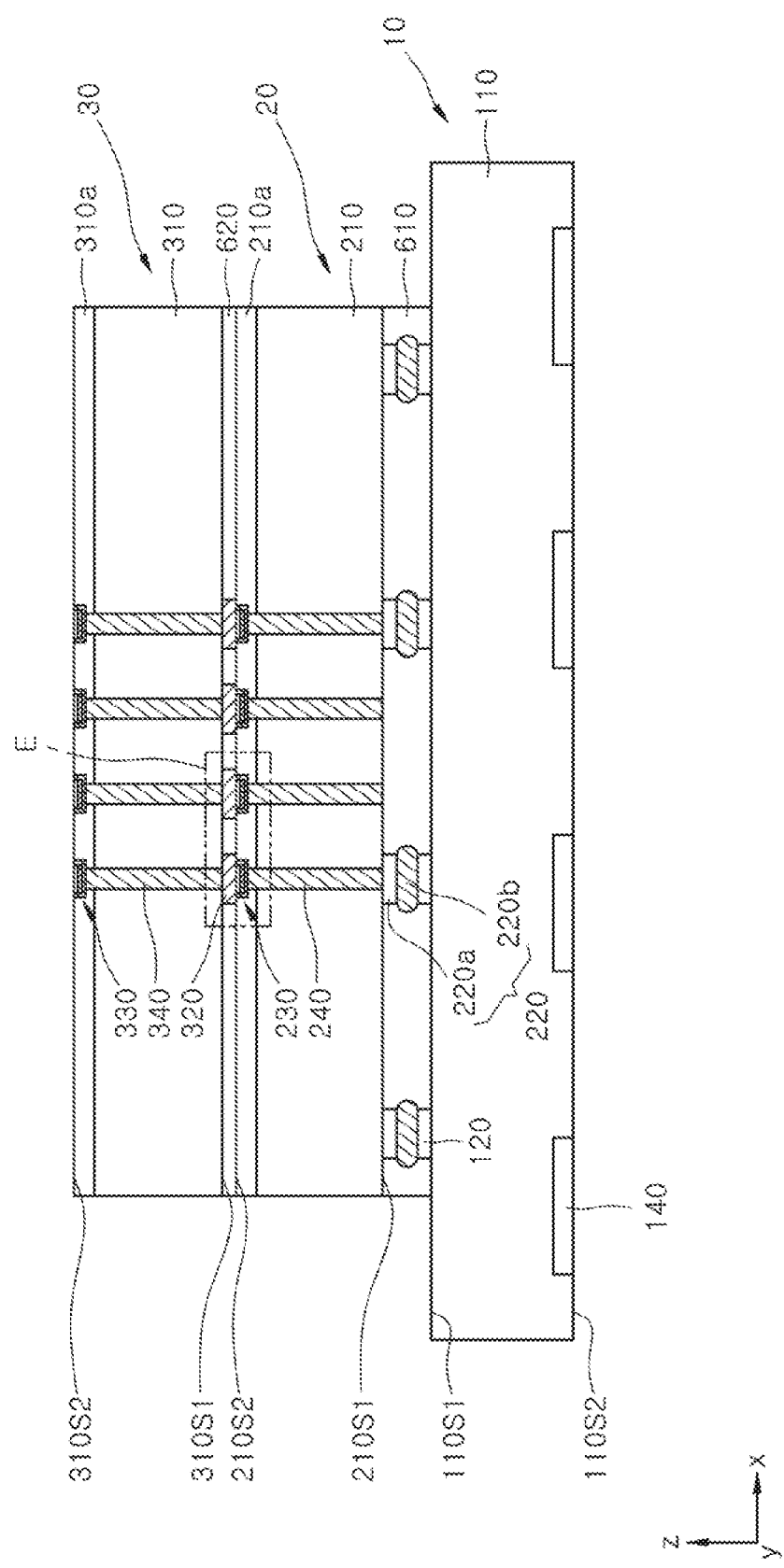

SEMICONDUCTOR PACKAGE INCLUDING EMBEDDED SOLDER CONNECTION STRUCTURE

CROSS-REFERENCE TO RELATED APPLICATIONS

The present application claims priority under 35 U.S.C 119(a) to Korean Application No. 10-2020-0043654, filed on Apr. 9, 2020, which is incorporated herein by references in its entirety.

BACKGROUND

1. Technical Field

The present disclosure generally relates to a semiconductor package and, more particularly, to a semiconductor package including an embedded solder connection structure.

2. Related Art

The semiconductor industry has evolved in the direction of manufacturing semiconductor products having light weight, small size, high speed, multi-functionality, high performance, and high reliability at low cost, and one of the important technologies to achieve such products is semiconductor package technology. Semiconductor package technology is a technology of mounting a semiconductor chip having a circuit portion formed on a package substrate through a wafer process, a technology of securing an electrical connection between a semiconductor chip and an external electronic device through the package substrate, and a technology of protecting the semiconductor chip from an external environment.

Recently, in response to a drive for lighter and shorter package products, research into structural stability and stability of electrical connections of a package substrate and semiconductor chips stacked on the package substrate has been continued.

SUMMARY

A semiconductor package according to an aspect of the present disclosure may include a first semiconductor chip including a first chip body portion and a first chip rear bump disposed in a region recessed into the first chip body portion, and a second semiconductor chip stacked on the first semiconductor chip and including a second chip body portion and a second chip front bump protruding from the second chip body portion. The first chip rear bump may include a lower metal layer and a solder layer disposed on the lower metal layer. The second chip front bump may be bonded to the solder layer. The second chip front bump may be disposed to cover at least the solder layer on a bonding surface of the second chip front bump and the solder layer.

A semiconductor package according to another aspect of the present disclosure may include a base member, a first semiconductor chip disposed on the base member, and a second semiconductor chip disposed on the first semiconductor chip. The first semiconductor chip may include a first chip body portion including a front surface and a rear surface, and a first chip rear bump disposed in a region recessed into the first chip body portion from the rear surface. The second semiconductor chip may include a second chip body portion including a front surface and a rear surface, and a second chip front bump protruding from the front surface of the second chip body portion. The first chip rear bump may include a lower metal layer and a solder layer disposed on the lower metal layer. The solder layer of the first semiconductor chip and the second chip front bump of the second semiconductor chip may be bonded to each other. The second chip front bump may be disposed to cover at least the solder layer on a bonding surface of the second chip front bump and the solder layer.

Disclosed is a method of manufacturing a semiconductor package according to another aspect of the disclosure. In the method, a first semiconductor chip including a first chip body portion and a first chip rear bump disposed in a region recessed into the first chip body portion may be prepared, wherein the first chip rear bump may include a lower metal layer and a solder material layer disposed on the lower metal layer. A second semiconductor chip including a second chip body portion and a second chip front bump protruding from the second chip body portion may be prepared. The solder material layer of the first semiconductor chip and the second chip front bump of the second semiconductor chip may be bonded to form a solder layer. In the bonding the solder material layer and the second chip front bump, the second chip front bump and the solder layer may be bonded so that the second chip front bump covers at least the solder layer on a bonding surface of the second chip front bump and the solder layer.

BRIEF DESCRIPTION OF THE DRAWINGS

FIGS. 3, 4A, 4B, 5, 6A, 6B, 6C, 7A, 7B, and 8, 9, and 10 are cross-sectional views illustrating a method of manufacturing a semiconductor package according to an embodiment of the present disclosure.

DETAILED DESCRIPTION

Figure 1:
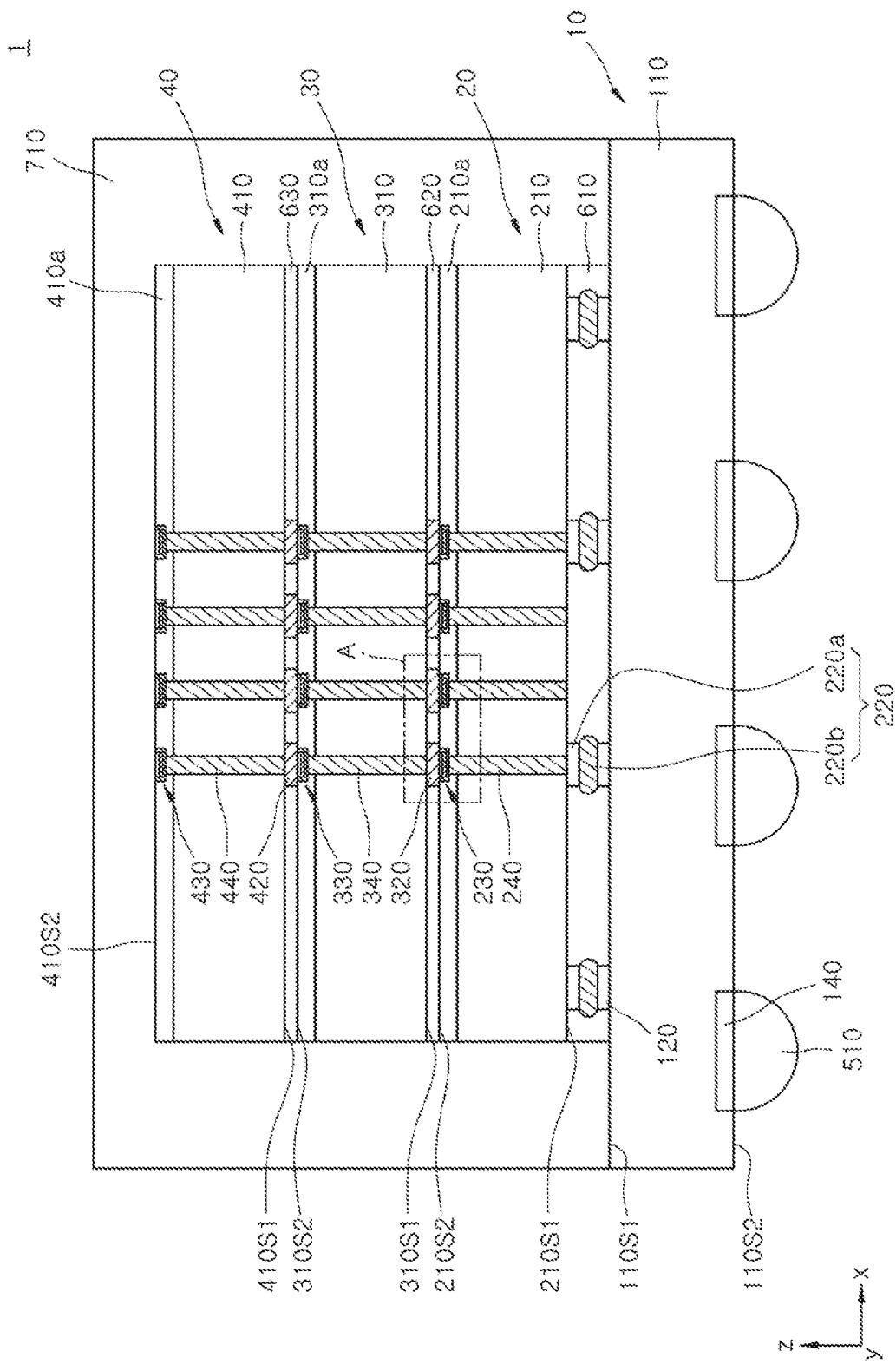
FIG. 1 is a cross-sectional view illustrating a semiconductor package according to an embodiment of the present disclosure.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

In the description of the embodiments of the present disclosure, descriptions such as "first" and "second" and "upper" and "lower" and "left" and "right" are for distinguishing members, and are not used to limit the members themselves or to mean a specific order.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

In the drawing figures, the dimensions (e.g., widths or thicknesses) of elements (e.g., layers or regions) may be exaggerated for clarity of illustration. In addition, the elements may be simplified to clearly illustrate their operations, their statuses, and relationships therebetween in the drawings. In the specification, descriptions of the drawings are based on an observer's point of view. It will be understood that when an element is referred to as being "on" another element, it can be directly "on" the other element or intervening elements may also be present. In the drawings, like reference numerals refer to like elements throughout. It is also noted that in this specification, "connected/coupled" refers to one component not only directly coupling another component but also indirectly coupling another component through an intermediate component. In addition, a singular form may include a plural form, and vice versa as long as it is not specifically mentioned.

Figure 2:
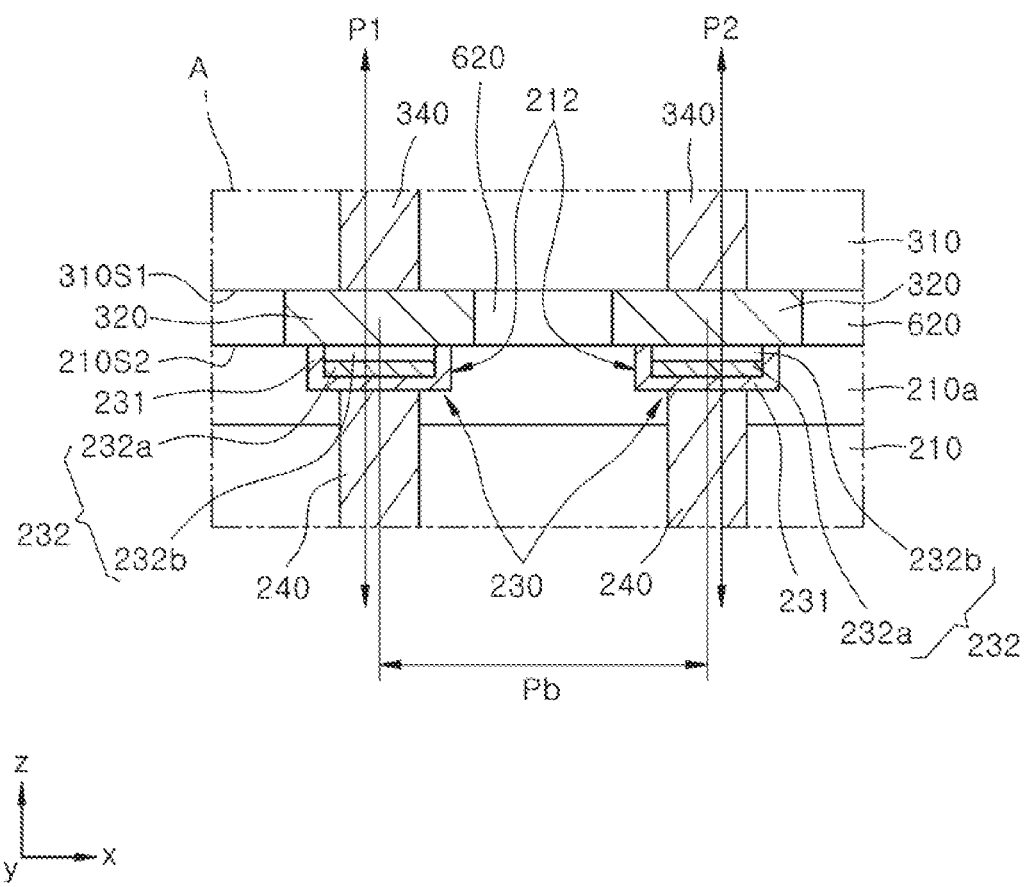
FIG. 2 is an enlarged view of region 'A' related to a connection structure between semiconductor chips in the semiconductor package of FIG. 1.

FIG. 1 is a cross-sectional view illustrating a semiconductor package 1 according to an embodiment of the present disclosure. FIG. 2 is an enlarged view of region 'A' related to a connection structure between semiconductor chips in the semiconductor package 1 of FIG. 1.

Referring to FIGS. 1 and 2, the semiconductor package 1 may include a base member 10, a first semiconductor chip 20 disposed on the base member 10, and a second semiconductor chip 30 disposed on the first semiconductor chip 20. In addition, the semiconductor package 1 may further include a third semiconductor chip 40 disposed on the second semiconductor chip 30. In FIGS. 1 and 2, one semiconductor chip is stacked on the second semiconductor chip 30, but is not necessarily limited thereto. In some embodiments, two or more semiconductor chips may be stacked on the second semiconductor chip 30. In addition, the semiconductor package 1 may further include a mold layer 710 surrounding the first to third semiconductor chips 20, 30, and 40 on the base member 10.

The base member 10 may electrically connect the first to third semiconductor chips 20, 30, and 40 to an external system. The base member 10 may be, for example, an interposer or a printed circuit board (PCB).

The base member 10 may include a base body 110. In an embodiment, the base body 110 may include a semiconductor material such as silicon (Si). In another embodiment, the base body 110 may include a ceramic material such as silicon oxide or glass. In another embodiment, the base body 110 may include a polymer material such as resin.

The base body 110 may include a first surface 110S1 and a second surface 110S2. The first surface 110S1 may be a surface facing the first semiconductor chip 20. The second surface 110S2 may be a surface opposite to the first surface 110S1, based on the base body 110.

Chip connection pads 120 for electrical connection to the first semiconductor chip 20 may be disposed on the first surface 110S1 of the base body 110. The chip connection pad 120 may be connected to a solder layer 220b of a first chip front bump 220, so that the base member 10 and the first semiconductor chip 20 can be electrically connected to each other. Bump pads 140 may be located at the second surface 110S2 of the base body 110. In an embodiment, the bump pads 140 may be embedded into the base body 110 except for a lower surface of the bump pad 140 positioned on the same plane as the second surface 110S2. In some embodiments, the bump pads 140 may be disposed to protrude outward from the second surface 110S2.

Connection structures 510 may be disposed on the lower surface of the bump pads 140. The connection structures 510 may be, for example, a solder bump or a solder ball. The connection structures 510 are connected to another printed circuit board or an external system, so that the printed circuit board or the external system can be electrically connected to the base member 10. The connection structures 510 may be classified into a power pin structure, a ground pin structure, or an input/output pin structure according to functions performed. The plurality of connection structures 510 may be spaced apart from each other on the second surface 110S2.

Although not illustrated, the base member 10 may include internal wirings. The internal wirings may include a plurality of circuit pattern layers, and vias electrically connecting the plurality of circuit pattern layers. The internal wirings may electrically connect the chip connection pads 120 to the bump pads 140. Accordingly, an electrical signal input from the other printed circuit board or the external system to the bump pad 140 through the connection structures 510 may reach the chip connection pad 120 via the internal wirings.

Referring to FIGS. 1 and 2, the first semiconductor chip 20 may be disposed on the base member 10. The first semiconductor chip 20 may include a first chip body portion 210. The first chip body portion 210 may be made of silicon (Si). The first semiconductor chip 20 may be a chip manufactured through a silicon integration process. The first chip body portion 210 may include a front surface 210S1 and a rear surface 210S2. Here, the front surface 210S1 may be a surface adjacent to a region where the integrated circuits inside the first semiconductor chip 20 are densely distributed. That is, an active element such as a transistor and a passive element such as a capacitor or a resistor may be integrated in an inner region of the first chip body portion 210 adjacent to the front surface 210S1. In addition, a plurality of wiring pattern layers electrically connected to the active element and the passive element may be disposed in an inner region of the first chip body portion 210 adjacent to the front surface 210S1. The rear surface 210S2 may be an opposite surface of the front surface 210S1, based on the first chip body portion 210. In the inner region of the first chip body portion 210 adjacent to the rear surface 210S2, integrated circuits might not exist or may be distributed at a relatively low density as compared to the first chip body portion 210 adjacent to the front surface 210S1.

First chip front bumps 220 may be disposed on the front surface 210S1 of the first chip body portion 210. The first chip front bumps 220 may be disposed to correspond to the chip connection pads 120 of the base member 10. Each of the first chip front bumps 220 may include a bump body 220a and a solder layer 220b. The bump body 220a may include, for example, copper (Cu) or nickel (Ni). The solder layer 220b may include a solder material including tin (Sn) and silver (Ag). By bonding the solder layers 220b of the first chip front bump 220 to the chip connection pads 120, the base member 10 can be electrically connected to the first semiconductor chip 20.

The first chip front bumps 220 may be electrically connected to the first chip through vias 240. Referring to FIG. 1, the first chip front bumps 220 may be disposed to contact the first chip through vias 240 in the z-direction, or may be disposed not to contact the first chip through vias 240 in the z-direction. When the first chip front bump 220 is not in contact with the first chip through via 240 in the z-direction, the first chip front bump 220 may be electrically to an end of the first chip through via 240 through a redistribution line (not shown) disposed in the first chip body portion 210.

In addition, first chip rear connection structures 230 may be disposed in regions adjacent to the rear surface 210S2 of the first chip body portion 210. The first chip rear connection structures 230 may contact the front bumps 320 of the second semiconductor chip 30. Through this, the first semiconductor chip 20 can be electrically connected to the second semiconductor chip 30. In addition, the first chip through vias 240 are disposed inside the first chip body portion 210 to electrically connect the first chip front bumps 220 to the first chip rear connection structures 230. Through the first chip through vias 240, the electric signal input to the first semiconductor chip 20 from the base member 10 can be transmitted toward the second semiconductor chip 30.

In some embodiments not illustrated, a gold (Au) layer may be additionally disposed on the surface of the bump body 220a of each of the first chip front bumps 220. The solder layer 220b may be disposed on the gold (Au) layer. The gold (Au) layer may function as an antioxidant layer for the bump body 220a. In addition, when the solder layer 220b bonds the bump body 220a and the chip connection pad 120, the gold (Au) layer may serve to promote the formation of an intermetallic compound in the solder layer 220b, or may be directly combined with the solder material in the solder layer 220b to be converted into an intermetallic compound. As described later, when the solder material includes tin (Sn), the intermetallic compound may include gold-tin ($AuSn_4$).

The first chip body portion 210 may include a first chip passivation layer 210a disposed in a region adjacent to the rear surface 210S2. For example, the first chip passivation layer 210a may be disposed to have a predetermined thickness in an inward direction of the first chip body portion 210 from the rear surface 210S2 of the first chip body portion 210. The first chip passivation layer 210a may include an inorganic material. As an example, the first chip passivation layer 210a may include silicon oxide, silicon nitride, or silicon oxynitride. The word "predetermined" as used herein with respect to a parameter, such as a predetermined thickness, predetermined voltages, or predetermined pitch, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Referring to FIGS. 1 and 2, the first chip rear connection structures 230 may be disposed adjacent to the rear surface 210S2 of the first chip body portion 210. The first chip rear connection structures 230 may be disposed in regions recessed from the rear surface 210S2 of the first chip body portion 210 into the first chip body portion 210. In an embodiment, referring to FIG. 2, trench patterns 212 may be formed in regions recessed into the first chip passivation layer 210a of the first chip body portion 210. The first chip rear connection structures 230 may be respectively disposed in the trench patterns 212. The first chip rear connection structures 230 may be electrically connected to the first chip through vias 240. Meanwhile, as illustrated, each of the first chip passivation layer 210a may be disposed to surround a portion of each of the first chip rear connection structures 230 and a portion of each of the first chip through vias 240.

Each of the first chip rear connection structures 230 may include a barrier layer 231 and a first chip rear bump 232. The first chip rear bump 232 may include a lower metal layer 232a and a solder layer 232b disposed on the lower metal layer 232a.

The barrier layer 231 may be disposed along an inner surface of the trench pattern 212. The barrier layer 231 may be disposed to surround the first chip rear bump 232. The barrier layer 231 can isolate the first chip rear bump 232 from the first chip passivation layer 210a. The barrier layer 231 can prevent material diffusion between the first chip rear bump 232 and the first chip passivation layer 210a. Further, the barrier layer 231 may be electrically connected to the first chip through via 240. As an example, the barrier layer 231 may include tantalum (Ta). In an embodiment, the barrier layer 231 may be a tantalum (Ta) layer. In another embodiment, the barrier layer 231 may be formed in a two-layer structure of a tantalum layer and a cobalt (Co) layer. At this time, the tantalum (Ta) layer may be disposed to contact the first chip passivation layer 210a and the first chip through via 240, and the cobalt (Co) layer may be disposed on the tantalum (Ta) layer.

The lower metal layer 232a may be disposed with a predetermined thickness on a portion of the barrier layer 231 corresponding to the bottom of the trench pattern 212. The lower metal layer 232a may provide metal constituting an intermetallic compound generated inside the solder layer 232b in the process of forming the solder layer 232b, which will be described later with reference to FIGS. 7A and 7B. In addition, the lower metal layer 232a may function to prevent copper (Cu) constituting the first chip through via 240 from diffusing into the solder layer 232b. The lower metal layer 232a may include nickel (Ni), as an example.

The solder layer 232b may be disposed on the lower metal layer 232a in a direction perpendicular to the bottom of the trench pattern 212. The solder layer 232b may be bonded to a second chip front bump 320 of the second semiconductor chip 30. As a result, the first chip rear bump 232 may be electrically connected to the second chip front bump 320.

Figure 7B:
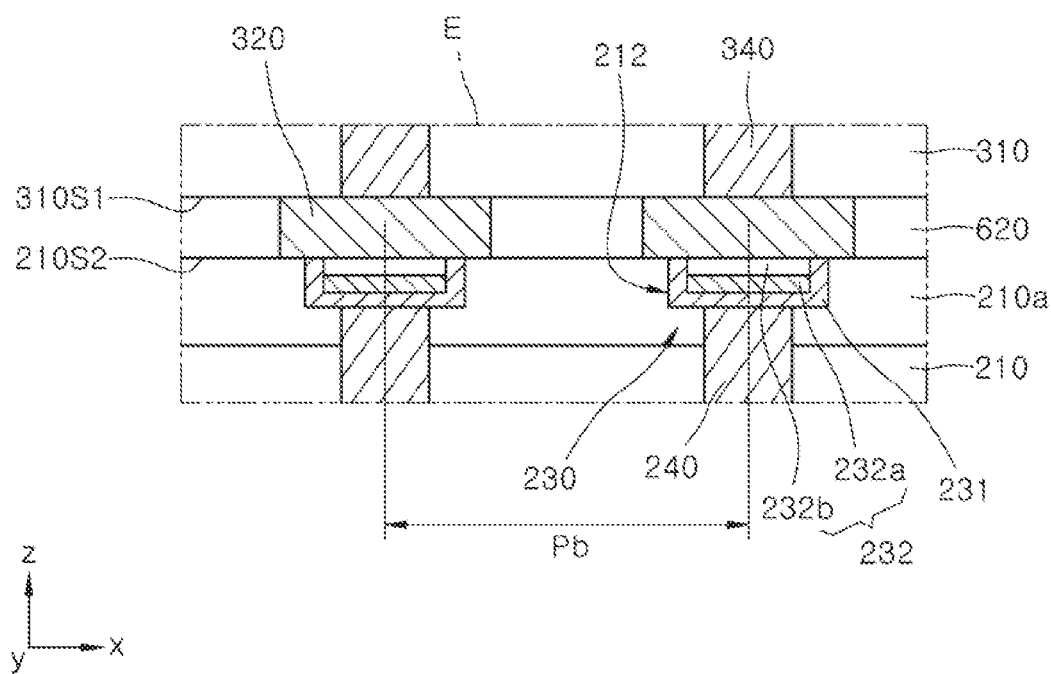

The solder layer 232b may include a solder material and an intermetallic compound. The solder material may include tin (Sn), silver (Ag), or the like. As described below, as illustrated in FIGS. 7A and 7B, when bonding the lower metal layer 232a of the first semiconductor chip 20 and the second chip front bump 320 of the second semiconductor chip 30 using the solder material layer 232c of the first chip rear bump 232 of the first semiconductor chip 20 illustrated in FIG. 4B, the solder material layer 232c may be converted into a solder layer 232b including the intermetallic compound. The intermetallic compound may be formed by at least one of a chemical reaction between the solder material layer 232c and the lower metal layer 232a and a chemical reaction between the solder material layer 232c and the second chip front bump 320.

In an embodiment, when each of the lower metal layer 232a and the second chip front bump 320 includes nickel (Ni), the intermetallic compound may include, for example, nickel-tin ($Ni_3Sn_4$). In some embodiments, a gold (Au) layer may be additionally disposed on the surface of the second chip front bump 320 to prevent the oxidation of the second chip front bump 320. In this case, the intermetallic compound may further include gold-tin ($AuSn_4$), as an example.

Each of the first chip rear bumps 232 may be disposed to have a predetermined pitch Pb with other first chip rear bumps in the lateral direction (i.e., the x-direction). As an example, the pitch Pb may be 10 μm or less.

A filling material layer 610 may be disposed in regions where the base member 10 and the first semiconductor chip 20 overlap in the z-direction. The filling material layer 610 may include an organic material. As an example, the filling material layer 610 may include an underfill. In some embodiments, the filling material layer 610 may include the same material as a mold layer 710. That is, when forming the mold layer 710, the regions in which the base member and the first semiconductor chip 20 overlap in the z-direction may be filled with a molding material without a separate process for forming the filling material layer 610.

Referring to FIGS. 1 and 2, the second semiconductor chip 30 may be disposed on the first semiconductor chip 20. The second semiconductor chip 30 may include a second chip body portion 310. The second chip body portion 310 may be formed of silicon (Si). The second semiconductor chip 30 may be a chip manufactured through a silicon (Si) integration process. The second chip body portion 310 may include a front surface 310S1 and a rear surface 310S2. Here, the front surface 310S1 may be a surface adjacent to a region where the integrated circuits inside the second semiconductor chip 30 are densely distributed. The rear surface 310S2 may be a surface opposite to the front surface 310S1, based on the second chip body portion 310. In an inner region of the second chip body portion 310 adjacent to the rear surface 310S2, integrated circuits might not exist or may be present at a relatively low density as compared to the second chip body portion 310 adjacent to the front surface 310S1.

The second chip front bumps 320 may be disposed on the front surface 310S1 of the second chip body portion 310. The second chip front bumps 320 may be disposed to protrude from the second chip body portion 310. As illustrated in FIG. 2, the second chip front bumps 320 may be bond to the solder layers 232b of the first chip rear bumps 232. The second chip front bump 320 may include, for example, nickel (Ni).

Second chip rear connection structures 330 may be disposed on the rear surface 310S2 of the second chip body portion 310. The second chip rear connection structures 330 may be electrically connected to the front bumps 420 of the third semiconductor chip 40. In addition, second chip through vias 340 that electrically connect the second chip front bumps 320 and the second chip rear connection structures 330 may be disposed inside the second chip body portion 310.

Referring to FIG. 2, the second chip front bumps 320 may be disposed to correspond to the first chip rear bumps 232 of the first chip body portion 210. On the bonding surfaces (i.e., rear surface 210S2) of the second chip front bumps 320 and the solder layers 232b in the first chip rear bumps 232, each of the second chip front bumps 320 may be disposed to have a predetermined pitch Pb with neighboring second chip front bumps. At this time, the pitch Pb between the second chip front bumps 320 may be substantially the same as the pitch Pb between the first chip rear bumps 232.

The second chip front bumps 320 may be disposed to cover at least the solder layers 232b at the bonding surfaces of the second chip front bumps 320 and the solder layers 232b. That is, each of the second chip front bump 320 may be disposed to cover the entirety of the solder layer 232b. Further, each of the second chip front bumps 320 may be disposed to additionally cover the barrier layer 231 at the bonding surface.

The second chip front bump 320 may be surrounded by a first polymer adhesion layer 620 on the front surface 310S1 of the second chip body portion 310. For example, a side surface of the second chip front bump 320 may be buried by the first polymer adhesion layer 620. The first polymer adhesion layer 620 may include, for example, a polymer material. The first polymer adhesion layer 620 may include, for example, a non-conductive film (NCF). The first polymer adhesion layer 620 may be bonded to the first chip passivation layer 210a of the first chip body portion 210. The bonding surface of the first polymer adhesion layer 620 and the first chip passivation layer 210a may be substantially the same plane as the bonding surface of the second chip front bump 320 and the solder layer 232b.

In an embodiment, the second chip front bump 320 may be disposed to cover the entirety of the solder layer 232b at the bonding surface of the second chip front bump 320 and the solder layer 232b. In addition, the solder layer 232b may be separated from the first chip passivation layer 210a by the barrier layer 231. The barrier layer 231 is separated from the first polymer adhesion layer 620 with the first chip passivation layer 210a therebetween, so that the solder layer 232b may be isolated from the first polymer adhesion layer 620 by the second chip front bump 320 and the barrier layer 231. That is, the solder layers 232b may be configured not to contact the first polymer adhesion layer 620.

Meanwhile, referring to FIG. 1 again, the second chip body portion 310 may include a second chip passivation layer 310a disposed in a region adjacent to the rear surface 310S2. For example, the second chip passivation layer 310a may be disposed to have a predetermined thickness in an inward direction of the second chip body portion 310 from the rear surface 310S2 of the second chip body portion 310. The second chip passivation layer 310a may include an inorganic material. As an example, the second chip passivation layer 310a may include silicon oxide, silicon nitride, or silicon oxynitride.

Referring to FIG. 1, second chip rear connection structures 330 may be disposed adjacent to the rear surface 310S2 of the second chip body portion 310. The second chip rear connection structures 330 may be disposed in regions recessed from the rear surface 310S2 of the second chip body portion 310 into the second chip body portion 310. The configuration of the second chip rear connection structures 330 may be substantially the same as the configuration of the first chip rear connection structures 230 of the first semiconductor chip 20. Therefore, description of the configuration of the second chip rear connection structures 300 is omitted. Although not illustrated, each of the second chip rear connection structures 330 may include a barrier layer, a second chip rear bump, and a second solder layer which correspond to the barrier layer 231, the first chip rear bump 232, and the first solder layer 232b of the first chip rear connection structure 230. The barrier layer, the second chip rear bump, and the second solder layer of the second chip rear connection structure 330 may be formed inside the trench pattern formed in the second chip passivation layer 310a. That is, the second chip passivation layer 310a may be disposed to surround the second chip rear connection structures 330. Also, the second chip passivation layer 310a may be disposed to further surround portions of the second chip through vias 340.

The second chip rear connection structures 330 may be bonded to the third chip front bumps 420 of the third semiconductor chip 40. The bonding structure between the second chip rear connection structure 330 and the third chip front bump 420 may be substantially the same as the above-described bonding structure of the first chip rear connection structure 230 and the second chip front bump 320.

Referring to FIG. 1 again, the third semiconductor chip 40 may be disposed on the second semiconductor chip 30. The third semiconductor chip 40 may include a third chip body portion 410 including a front surface 410S1 and a rear surface 410S2. The third semiconductor chip 40 may include third chip front bumps 420 disposed on the front surface 410S1 of the third chip body portion 410. At this time, the third chip front bumps 420 on the front surface 410S1 of the third chip body portion 410 may be surrounded by a second polymer adhesion layer 630.

The third semiconductor chip 40 may include a third chip passivation layer 410a disposed in a region adjacent to the rear surface 410S2 of the third chip body portion 410. In addition, the third semiconductor chip 40 may include third chip rear connection structures 430 disposed adjacent to the rear surface 410S2 of the third chip body portion 410. The third semiconductor chip 40 may include third chip through vias 440 connecting the third chip front bumps 420 and the third chip rear connection structures 430.

Meanwhile, the configuration of the third semiconductor chip may be substantially the same as the configuration of the second semiconductor chip 30. As an example, the configurations of the third chip body portion 410, the third chip passivation layer 410a, the third chip front bumps 420, the third chip rear connection structures 430, and the third chip through vias 440 may be substantially the same as the configurations of the second chip body portion 310, the second chip passivation layer 310a, the second chip front bumps 320, the second chip rear connection structures 330, and the second chip through vias 340. In addition, the configuration of the second polymer adhesion layer 630 may be substantially the same as the configuration of the first polymer adhesion layer 620.

In some embodiments, when a plurality of semiconductor chips are stacked on the base member 10, the uppermost semiconductor chip among the plurality of semiconductor chips might not include the chip through via and the chip rear connection structure. That is, in FIG. 1, when the first to third semiconductor chips 20, 30, and 40 are stacked on the base member 10, the third semiconductor chip 40, the uppermost layer, might not include the third rear connection structures 430 and the third chip through vias 440.

Referring to FIG. 1 again, the mold layer 710 surrounding the first to third semiconductor chips 20, 30, and 40 may be disposed on the base member 10. The mold layer 710 may include, for example, epoxy molding compound (EMC). The molding layer 710 may serve to physically or chemically protect the first to third semiconductor chips 20, 30, and 40 from an external environment.

As described above, the chip through vias 240, 340, and 440 may be respectively employed in the semiconductor chips 20, 30, and 40 for exchanging electrical signals between the base member and the semiconductor chips 20, 30, and 40 stacked on the base member 10. According to various embodiments of the disclosure, the solder layer 232b electrically connecting the first and second semiconductor chips 20 and 30 may be isolated from the first polymer adhesion layer 620 by the second chip front bumps 320, the barrier layer 231, and the first chip passivation layer 210a. Such physical isolation can prevent defects caused by electrochemical reactions, such as a conductive anodic filament generation phenomenon. The conductive anodic filament generation phenomenon may be an electrochemical reaction in which a filament made of a material of the anode is generated in a polymer layer when an electric field is applied between the anode and the cathode, in a structure in which an anode and a cathode are disposed in contact with the polymer layer. The electrochemical reaction may occur when a high electric field is applied between the anode and the cathode in a state in which the polymer layer absorbs moisture in an environment of high temperature and high humidity, and the insulation of the polymer layer deteriorates.

More specifically, when a high electric field is applied in the environment, after the conductive chemical species in the anode are oxidized, the oxidized conductive chemical species may be released into the polymer layer in the form of ions. The released ions of the conductive chemical species may move toward the cathode along the electric field and are reduced by obtaining electrons, thereby forming a conductive filament inside the polymer layer. When the conductive chemical species forms the conductive filament, defects such as an electrical short-circuit may occur between the anode and the cathode.

Referring to FIG. 2 again, signal exchange between the first semiconductor chip 20 and the second semiconductor chip 30 may be performed through a first electrical path P1 and a second electrical path P2. Here, the first electrical path P1 represents an electric signal flow through the first chip through via 240, the first chip rear connection structure 230, the second chip front bump 320, and the second chip through via 340 which are disposed on a left side in FIG. 2. The second electrical path P2 represents an electric signal flow through the first chip through via 240, the first chip rear connection structure 230, the second chip front bump 320, and the second chip through via 340 which are disposed on a right side in FIG. 2. Here, in order to generate the electric signal flows along the first and second electrical paths P1 and P2, predetermined voltages may be applied to the first and second electrical paths P1 and P2, respectively.

If, unlike the present embodiments of the present disclosure illustrated in FIG. 2, the solder layer 232b (i.e., the solder layer 232b shown on the left side in FIG. 2) located in the first electrical path P1 and the solder layer 232b (i.e., the solder layer 323b shown on the right side in FIG. 2) located in the second electrical path P2 directly contact the first polymer adhesion layer 620, respectively, electrical defects such as the above-described conductive anodic filament may be generated. That is, in an environment of high temperature and high humidity, when the voltage applied to the first electrical path P1 and the voltage applied to the second electrical path P2 generate a voltage difference across the first polymer adhesion layer 620, one of the solder layers 232b in the first and second electrical paths P1 and P2 may function as an anode and the other as a cathode. Accordingly, tin (Sn) inside the solder layers 232b serving as the anode may be oxidized to generate tin (Sn) ions, and the tin (Sn) ions may move inside the first polymer adhesion layer 620 toward the cathode. In addition, the tin (Sn) ions may be reduced inside the first polymer adhesive layer 620 to form a filament of tin (Sn). The filament of tin (Sn) may generate an electrical short-circuit between the anode and the cathode.

Meanwhile, referring to FIG. 2 again, according to an embodiment of the present disclosure, the second chip front bump 320, the barrier layer 231, and the first chip passivation layer 210a may allow the solder layer 232b and the first polymer adhesion layer 620 to be separated from each other. Accordingly, when predetermined voltages are applied along the first electrical path P1 and the second electrical path P2, respectively, a phenomenon that tin (Sn) inside the solder layer 323b moves into the first polymer adhesion layer 620 by the electrochemical reaction described above may be prevented. As a result, according to an embodiment of the present disclosure, the solder layers 232b are structurally stabilized, so that the electrical reliability of solder bonding between the first and second semiconductor chips can be secured.

Meanwhile, the electrical connection structure between the second and third semiconductor chips 30 and 40 may be substantially the same as the electrical connection structure between the first and second semiconductor chips 20 and 30. Accordingly, the electrical reliability of the solder bonding positioned between the second and third semiconductor chips 30 and 40 can be secured in the same manner.

Figure 4B:
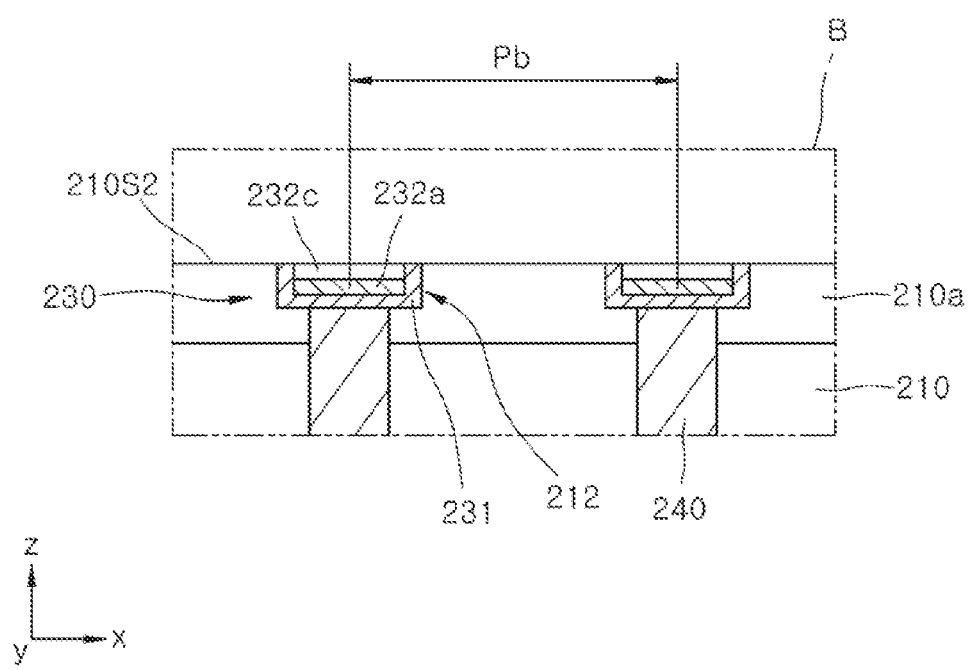
Figure 5:
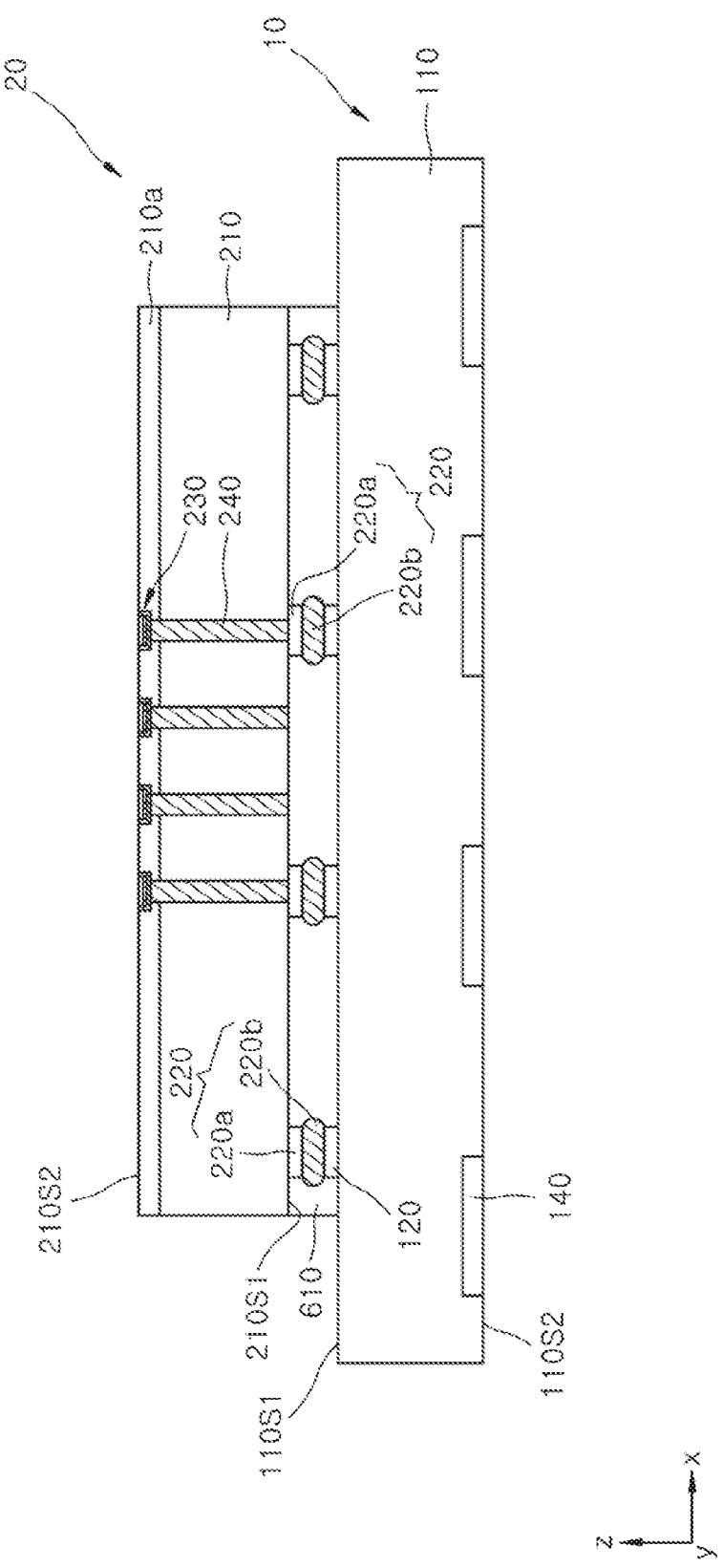
Figure 6B:
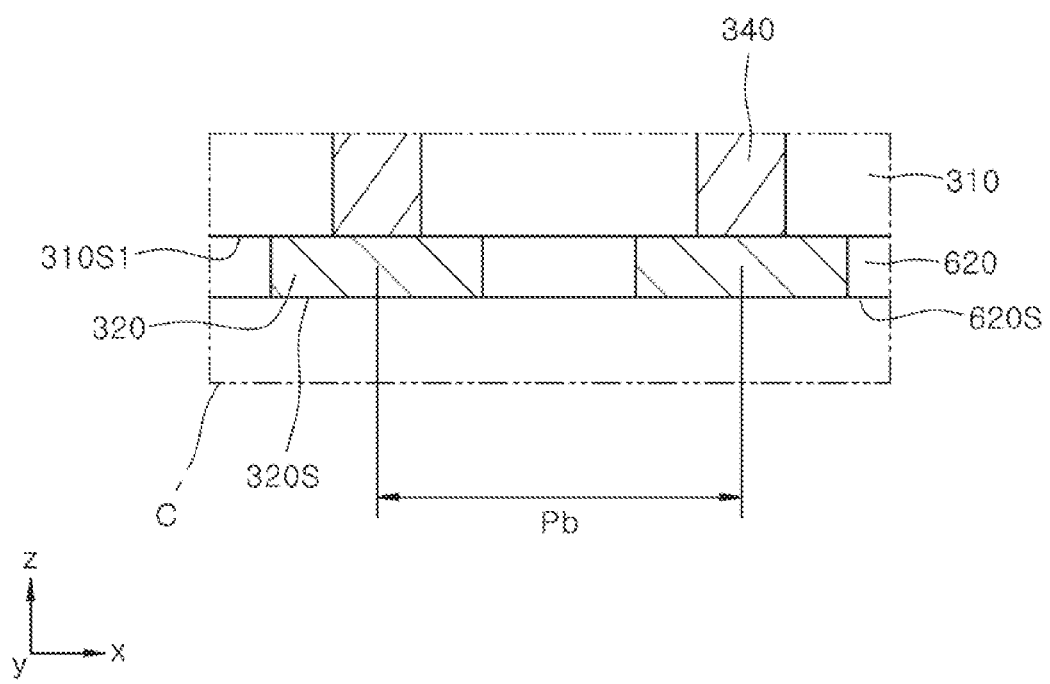
Figure 6C:
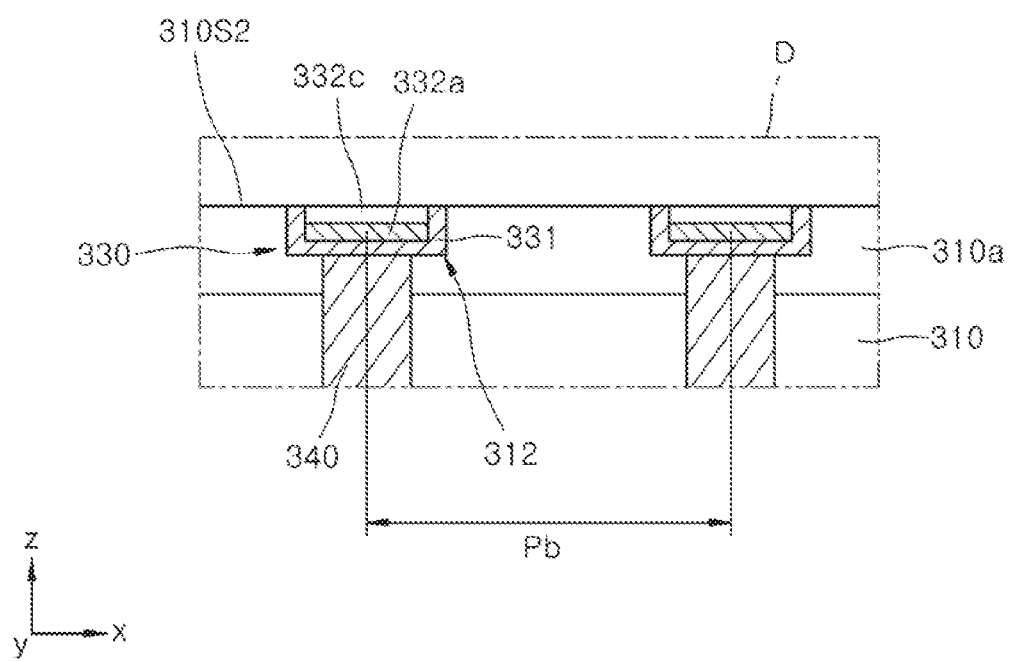

FIGS. 3, 4A, 4B, 5, 6A, 6B, 6C, 7A, 7B, and 8 to 10 are cross-sectional views illustrating a method of manufacturing a semiconductor package according to an embodiment of the present disclosure. Here, FIG. 4B is an enlarged view of a region 'B' of FIG. 4A. FIG. 6B is an enlarged view of a region "C" of FIG. 6A, and FIG. 6C is an enlarged view of a region "D" of FIG. 6A. FIG. 7B is an enlarged view of a region 'E' of FIG. 7A.

Referring to FIG. 3, a base member 10 may be provided. The base member 10 may include a base body 110 having a first surface 110S1 and a second surface 110S2. Chip connection pads 120 may be disposed on the first surface 110S1 of the base body 110.

Bump pads 140 may be exposed to the second surface 110S2 of the base body 110. In an embodiment, each of the bump pad 140 may be buried inside the base body 110 except for the lower surface of the bump pad 140 positioned on the same plane as the second surface 110S2. In some embodiments, the bump pads 140 may be disposed to protrude outward from the second surface 110S2.

Although not illustrated, the base member 10 may include internal wirings. The internal wirings may include a plurality of circuit pattern layers and vias electrically connecting the plurality of circuit pattern layers. The internal wirings may electrically connect the chip connection pads 120 to the bump pads 140.

Referring to FIGS. 4A and 4B, a first semiconductor chip 20 may be provided. The first semiconductor chip 20 may include a first chip body portion 210. The first chip body portion 210 may be made of silicon (Si). A plurality of integrated circuit layers manufactured through a silicon process and a plurality of insulation layers insulating the plurality of integrated circuit layers may be disposed in the first chip body portion 210. The first chip body portion 210 may include a front surface 210S1 and a rear surface 210S2.

Bump bodies 220a may be formed on the front surface 210S1 of the first chip body portion 210. Each of the bump bodies 220a may include, for example, nickel (Ni). A solder material layer 220c may be formed on each of the bump bodies 220a. The solder material layer 220c may include, for example, tin (Sn), silver (Ag), or the like. The bump bodies 220a and the solder material layers 220c may be formed through a plating process.

The first chip body portion 210 may include a first chip passivation layer 210a. The first chip passivation layer 210a may be formed to have a predetermined thickness in an inward direction of the first chip body portion 210 from the rear surface 210S2 of the first chip body portion 210. The first chip passivation layer 210a may include an inorganic material. As an example, the first chip passivation layer 210a may include silicon oxide, silicon nitride, or silicon oxynitride. The first chip passivation layers 210a may be formed in the first chip body portion 210 through a semiconductor thin film deposition process such as a chemical vapor deposition or a physical vapor deposition.

First chip rear connection structures 230 may be formed adjacent to the rear surface 210S2 of the first chip body portion 210. Referring to FIGS. 4A and 4B together, the process of forming the first chip rear connection structures 230 may be performed as follows. First, trench patterns 212 may be formed from the rear surface 210S2 to the inside of the first chip body portion 210. For example, the trench patterns 212 may be formed inside the first chip passivation layer 210a of the first chip body portion 210. For the process of forming the trench pattern 212, a semiconductor lithography process and an etching process may be applied.

Subsequently, barrier layers 231 may be formed along the inner surfaces of the trench patterns 212. As an example, each of the barrier layers 231 may include tantalum (Ta). In an embodiment, the barrier layer 231 may be a tantalum (Ta) layer. In another embodiment, the barrier layer 231 may be formed in a two-layer structure of a tantalum (Ta) layer and a cobalt (Co) layer. In this case, the tantalum (Ta) layer may be disposed to contact the first chip passivation layer 210a and the first chip through via 240, and the cobalt (Co) layer may be disposed on the tantalum (Ta) layer. The process of forming the barrier layers 231 may be, for example, performed using a semiconductor thin film deposition process such as sputtering.

Subsequently, lower metal layers 232a may be formed to a predetermined thickness on portions of the barrier layers 231 corresponding to the bottom surfaces of the trench patterns 212. Each of the lower metal layer 232a may include nickel (Ni), as an example. The lower metal layer 232a may be formed by, for example, a plating method. In an embodiment, a plating seed layer (not illustrated) may be formed on the barrier layer 231, and the lower metal layer 232a may be formed by an electrolytic plating method using the plating seed layer.

Subsequently, a solder material layer 232c may be formed by a predetermined thickness on the lower metal layer 232a. The solder material layer 232c may be formed, for example, using a plating method. The solder material layer 232c may include, for example, a solder material such as tin (Sn), silver (Ag), or the like. Here, the upper surface of the solder material layer 232c may be controlled to be positioned at substantially the same level as the rear surface 210S2 of the first chip body portion 210.

In an embodiment, each of the trench patterns 212 may be formed to have a predetermined interval from neighboring trench patterns. Accordingly, each of the first chip rear connection structures 230 formed inside the trench patterns 212 may have a predetermined pitch Pb with other first chip rear connection structures neighboring in the lateral direction (i.e., the x-direction). The pitch Pb may be, for example, 10 μm or less.

Referring to FIG. 4A, first chip through vias 240 electrically connecting the first chip front bumps 220 to the first chip rear connection structures 230 may be formed in the first chip body portion 210. The first chip through vias 240 may be formed through a plating process.

Referring to FIG. 5, a first semiconductor chip 20 may be stacked on the base member 10. For example, the bump bodies 220a and the chip connection pads 120 may be bonded to each other using the solder material layers 220c formed on the bump bodies 220a illustrated in FIG. 4A. Accordingly, the base member 10 and the first semiconductor chip 20 can be electrically connected to each other.

In the bonding process, the solder material layer 220c of the first semiconductor chip 20 illustrated in FIG. 4A may be placed on the corresponding chip connection pads 120 of the base member 10 shown in FIG. 3, and heat may be applied to the solder material layers 220c. The solder of the solder material layer 220c flows by the heat, so that the chip connection pads 120 and the bump bodies 220a can be bonded to each other. Thereafter, the solder may be cooled and the solder material layers 232c can be converted into solder layers 220b illustrated in FIG. 5.

The solder layer 220b may further include an intermetallic compound produced by a solder component originating from the solder material layer 220c and a chemical reaction. The chemical reaction may include at least one of a chemical reaction between the solder material layer 220c and the bump body 220a and a chemical reaction between the solder material layer 220c and the chip connection pad 120. The intermetallic compound may include, for example, nickel-tin ($Ni_3Sn_4$) or copper-tin (Cu—Sn).

Subsequently, a filling material layer 610 may be formed in regions where the base body 110 and the first chip body portion 210 overlap in the z-direction. The filling material layer 610 may include a polymer material. As an example, the filling material layer 610 may be formed by an underfill process using an underfill. In some embodiments, the process of forming the filling material layer 610 may be omitted. Instead, in the process of forming a mold layer 710 to be described with reference to FIG. 9, a process of filling the overlapping regions of the base body 110 and the first chip body portion 210 with a molding material may be performed together.

Referring to FIGS. 6A to 6C, a second semiconductor chip 30 may be provided. The second semiconductor chip 30 may include a second chip body portion 310. The second chip body portion 310 may include a front surface 310S1 and a rear surface 310S2.

Second chip front bumps 320 may be formed on the front surface 310S1 of the second chip body portion 310. Second chip rear connection structures 330 may be formed in regions of the second chip body portion 310 adjacent to the rear surface 310S2. In addition, in the second chip body portion 310, a second chip passivation layer 310a may be formed in an inner region adjacent to the rear surface 310S2. Referring to FIG. 6C, the second chip rear connection structures 330 may be formed in the trench patterns 312 formed inside the second chip passivation layer 310a. Each of the second chip rear connection structures 330 may include a barrier layer 331, a lower metal layer 332a, and a solder material layer 332c. Further, referring to FIG. 6A again, in the second chip body portion 310, second chip through vias 340 electrically connecting the second chip front bumps 320 to the second chip rear connection structures 330 may be formed.

In an embodiment, the configuration of the second semiconductor chip 30 illustrated in FIGS. 6A to 6C may be substantially the same as the configuration of the first semiconductor chip 20 described above with reference to FIGS. 4A and 4B, except for the second chip front bumps 320. That is, the configurations of the second chip body portion 310, the second chip passivation layer 310a, the second chip rear connection structures 330, and the second chip through vias 340 of the second semiconductor chip 30 may be substantially the same as the configurations of the first chip body portion 210, the first chip passivation layer 210a, the first chip rear connection structures 230, and the first chip through vias 240 of the first semiconductor chip 20.

Referring to FIGS. 6A to 6C, the area of each of the second chip front bumps 320 positioned on the front surface 310S1 of the second semiconductor chip 30 may be greater than the area of each of the solder material layers 232c positioned on the rear surface 210S2 of the first semiconductor chip 20 illustrated in FIG. 4B. Accordingly, as described later in connection with FIGS. 7A and 7B, when the corresponding second chip front bumps 320 and solder material layers 232c are bonded, respectively, each of the second front bumps 320 at the bonding interface can cover the entirety of each of the solder material layers 232c. In this case, the bonding interface may be substantially the same plane as the rear surface 210S2 of the first chip body portion 210.

Referring to FIGS. 6A and 6B, each of the second chip front bumps 320 may have a pitch Pb of a second pitch size with a neighboring second chip front bump 320 in the lateral direction (i.e., the x-direction) on the front surface 310S1. The pitch Pb of the second chip front bump 320 may correspond to the pitch Pb of the first chip rear bump 230 of the first semiconductor chip 20 illustrated in FIG. 4A. Meanwhile, referring to FIGS. 6A and 6C together, the second chip rear connection structure 330 may have a predetermined pitch Pb with other second rear connection structures neighboring in the lateral direction (i.e., the x-direction).

Referring to FIGS. 6A and 6B, a first polymer adhesion layer 620 surrounding the second chip front bumps 320 may be formed on the front surface 310S1 of the second chip body portion 310. The first polymer adhesion layer 620 may include, for example, a polymer material such as resin. As an example, the first polymer adhesion layer 620 may include a non-conductive film (NCF).

The method of forming the first polymer adhesive layer 620 may be performed using methods of various embodiments as follows. In an embodiment, an adhesive film of a polymer component may be prepared. The adhesive film may be attached by applying pressure on the front surface 310S1 of the second chip body portion 310. Through this, the adhesive film can cover the second chip front bumps 320. At this time, the adhesive film may be selectively removed, so that the adhesive film is not applied on one surface 320S of the second chip front bump 320. In another embodiment, a liquid polymer adhesive having a predetermined viscosity may be prepared. As an example, by applying a coating method, the polymer adhesive may be coated on the front surface 310S1 of the second chip body portion 310. Then, the coated polymer adhesive may be incompletely cured, so that the incompletely cured adhesive may cover the second chip front bumps 320. At this time, the incompletely cured polymer adhesive may be selectively removed, so that the polymer adhesive is not applied on one surface 320S of the second chip front bump 320. In another embodiment, a photosensitive polymer adhesive may be prepared. The photosensitive polymer adhesive may be coated on the front surface 310S1 of the second chip body portion 310, so that the photosensitive polymer adhesive may cover the second chip front bumps 320. Thereafter, the photosensitive polymer adhesive may be selectively exposed and developed to selectively remove the polymer adhesive applied on one surface 320S of each of the second chip front bumps 320. By applying the methods of the various embodiments described above, the first polymer adhesion layer 620 surrounding the second chip front bumps 320 may be formed on the front surface 310S1. As a result of forming the first polymer adhesion layer 620 by the various methods described above, as illustrated in FIG. 6B, one surface 320S of each of the second chip front bumps 320 and one surface 620S of the first polymer adhesion layer 620 may be disposed on substantially the same plane.

Referring to FIGS. 7A and 7B, the second semiconductor chip may be stacked on the first semiconductor chip 20. For example, by applying heat and pressure, the solder material layer 232c in the first chip rear connection structure 230 of the first chip body portion 210 illustrated in FIG. 4B may be bonded to the second chip front bump 320 of the second chip body portion 310 illustrated in FIGS. 6A and 6B. In the bonding process, the solder material layer 232c may be converted into a solder layer 232b. In addition, in the z-direction, a space between the first chip body portion 210 and the second chip body portion 310 may be filled with the first polymer adhesion layer 620.

As described above with reference to FIGS. 6A and 6B, the area of each of the second chip front bumps 320 positioned on the front surface 310S1 of the second chip body portion 310 may be greater than the area of the solder material layer 232c positioned on the rear surface 210S2 of the first chip body portion 210 described above with reference to FIG. 4B. Accordingly, as a result of bonding the second chip front bumps 320 and the solder material layers 232c corresponding to each other, each of the second chip front bumps 320 at the bonding interface may cover the entirety of each of the solder layers 232b. The bonding interface may be substantially the same plane as the rear surface 210S2 of the first chip body portion 210.

Figure 8:
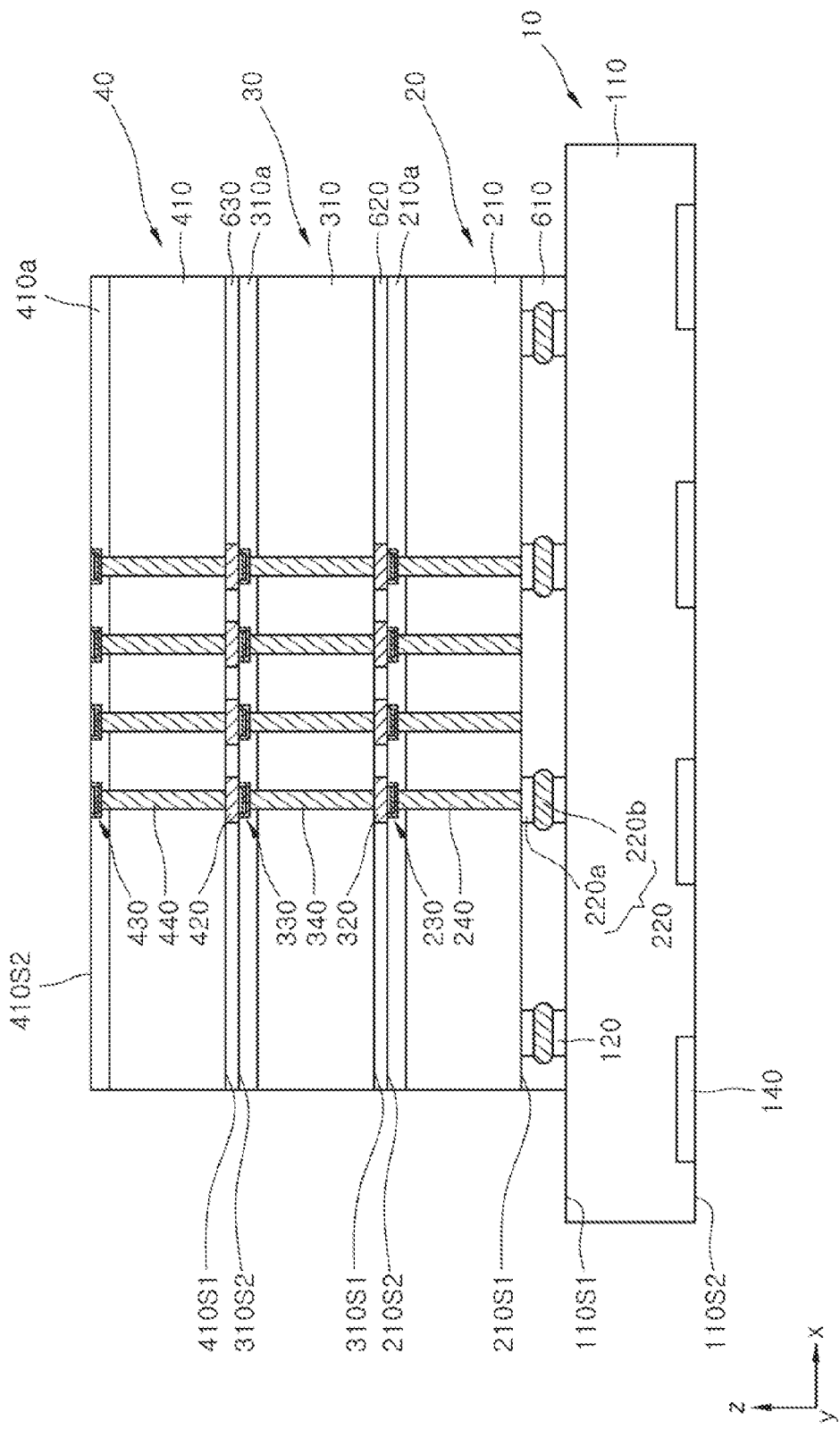

Referring to FIG. 8, a third semiconductor chip 40 may be stacked on the second semiconductor chip 30. The third semiconductor chip 40 may include a third chip body portion 410. The third chip body portion 410 may include a front surface 410S1 and a rear surface 410S2.

Third chip front bumps 420 may be formed on the front surface 410S1 of the third chip body portion 410. Third chip rear connection structures 430 may be formed in regions adjacent to the rear surface 410S2 of the third chip body portion 410. In addition, the third chip body portion 410 may include a third chip passivation layer 410a formed in an inner region adjacent to the rear surface 410S2. Third chip through vias 440 connecting the third chip front bumps 420 to the third chip rear connection structures 430 may be formed inside the third chip body portion 410.

The configuration of the third semiconductor chip 40 may be substantially the same as the configuration of the second semiconductor chip 30. That is, the configurations of the third chip body portion 410, the third chip passivation layer 410a, the third chip front bumps 420, the third chip rear connection structures 430, and the third chip through vias 440 may be substantially the same as the configurations of the second chip body portion 310, the second chip passivation layer 310a, the second chip front bumps 320, the second chip rear connection structures 330, and the second chip through vias 340.

In some embodiments, the uppermost semiconductor chip among the plurality of semiconductor chips sequentially stacked on the base member 10 of the semiconductor package might not include the chip through vias and the chip rear connection structures. Referring to FIG. 8, the third semiconductor chip 40 disposed as the top layer on the base member 10 might not include the third chip rear connection structures 430 and the third chip through vias 440, unlike what is shown.

Meanwhile, the method of stacking the third semiconductor chip 40 on the second semiconductor chip 30 may be substantially the same as the method of stacking the second semiconductor chip on the first semiconductor chip 20, described above with reference to FIGS. 7A and 7B.

Figure 9:
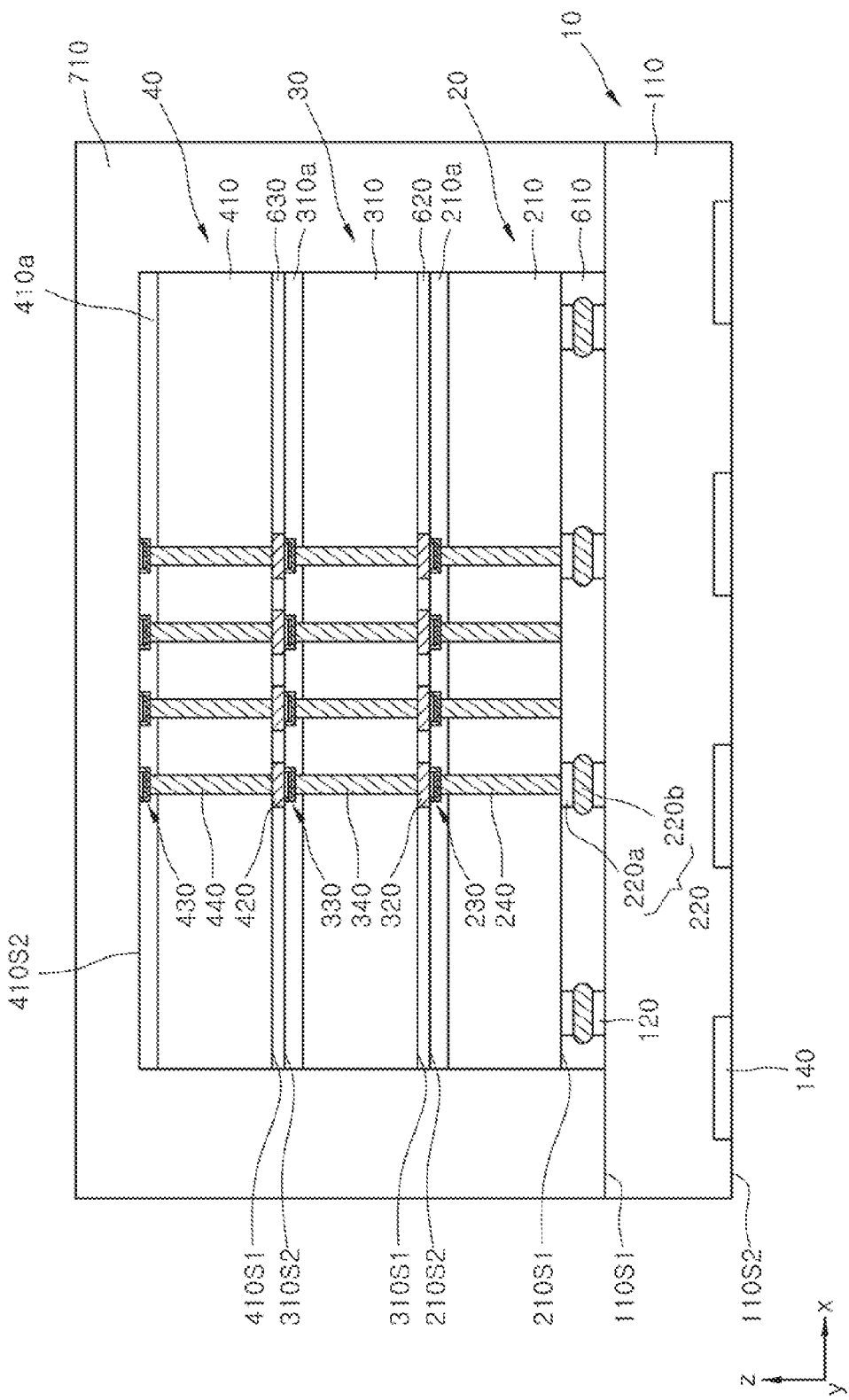

Referring to FIG. 9, a mold layer 710 may be formed to cover the first to third semiconductor chips 20, 30, and 40 on the base member 10. In a method of forming the mold layer 710, as an example, an epoxy molding compound (EMC) may be provided on the base member 10 to bury the first to third semiconductor chips 20, 30, and 40. In some embodiments, in the bonding process of the base member 10 and the first semiconductor chip 20 described with reference to FIG. 5, when the process of forming the filling material layer 610 in the region where the base body 110 and the first chip body portion 210 overlap in the z-direction is omitted, the process of filling the epoxy molding material in the region where the base body 110 and the first chip body portion 210 overlap in the z-direction may be performed in the forming operation of the mold layer 710 of FIG. 9.

Figure 10:
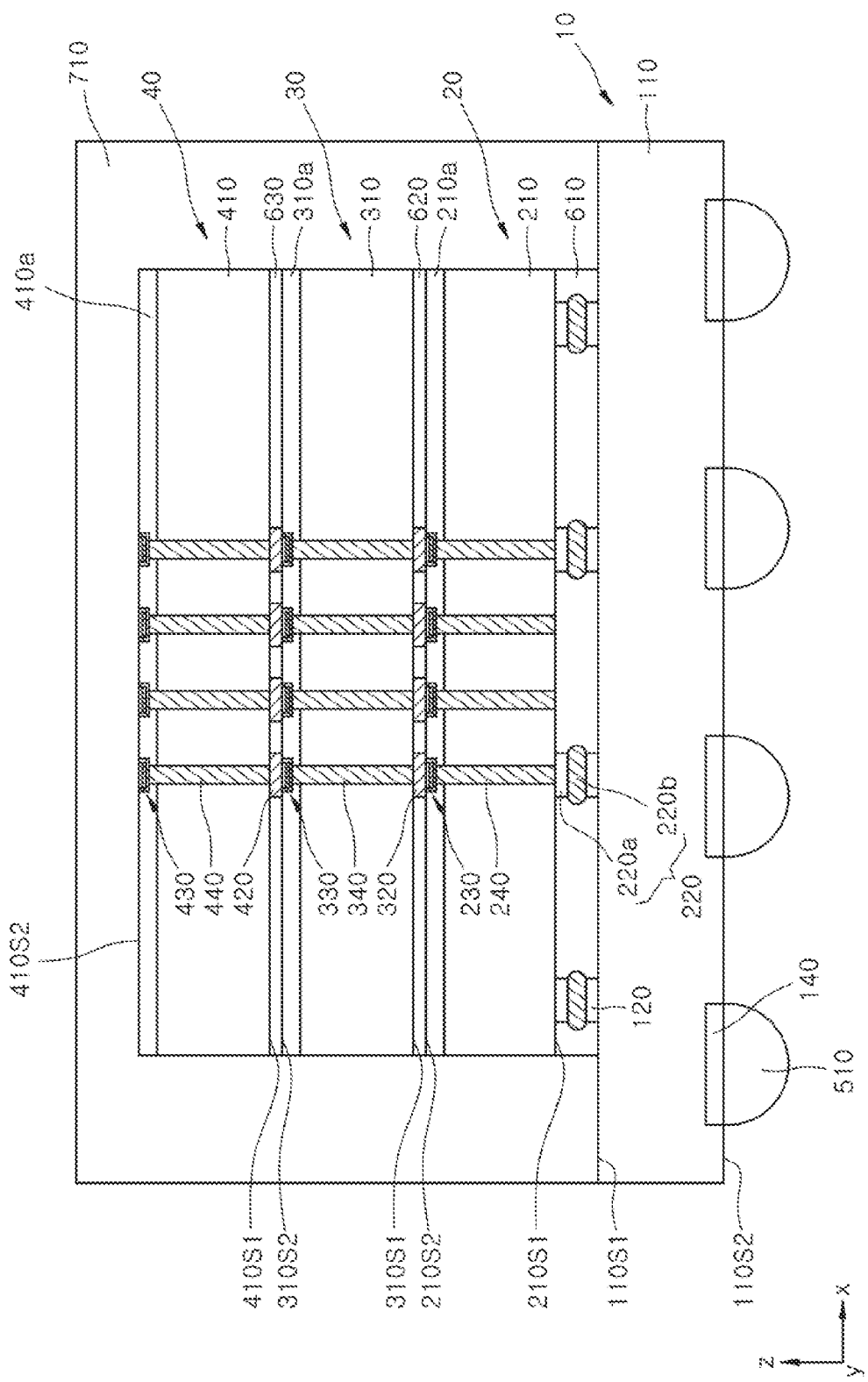

Referring to FIG. 10, connection structures 510 may be formed on the second surface 110S2 of the base body 110. The connection structures 510 may be formed on the bump pads 140, respectively. Each of the connection structures 510 may be a solder bump or a solder ball.

Through the above described process, the semiconductor package according to an embodiment of the present disclosure can be manufactured.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
a first semiconductor chip comprising a first chip body portion and a first chip rear bump disposed in a recessed region recessed into the first chip body portion; and
a second semiconductor chip stacked on the first semiconductor chip and comprising a second chip body portion and a second chip front bump protruding from the second chip body portion,
wherein the first chip rear bump comprises a lower metal layer and a solder layer disposed on the lower metal layer,
the second chip front bump is bonded to the solder layer, and
the second chip front bump is disposed to cover at least the solder layer on a bonding surface of the second chip front bump and the solder layer,
wherein the semiconductor package further comprises a polymer adhesion layer located between the first chip body portion and the second chip body portion, and
wherein the solder layer is isolated from the polymer adhesion layer.

2. The semiconductor package of claim 1,
wherein the solder layer is isolated from the polymer adhesion layer by the second chip front bump and the first chip body portion.

3. The semiconductor package of claim 1, wherein the first semiconductor chip further comprises:
a trench pattern formed in the recessed region; and
a barrier layer disposed along an inner surface of the trench pattern,
wherein the lower metal layer is disposed on a portion of the barrier layer corresponding to a bottom of the trench pattern, and
the solder layer is disposed on the lower metal layer.

4. The semiconductor package of claim 3, further comprising:
a polymer adhesion layer located between the first chip body portion and the second chip body portion,
wherein the solder layer is isolated from the polymer adhesion layer by at least one of the second chip front bump, the first chip body portion, and the barrier layer.

5. The semiconductor package of claim 1,
wherein the first semiconductor chip includes a first chip through via, and the second semiconductor chip includes a second chip through via,
wherein the first chip through via penetrates the first chip body portion to be electrically connected to the first chip rear bump, and the second chip through via penetrates the second chip body portion to be electrically connected to the second chip front bump.

6. The semiconductor package of claim 1, further comprising a first chip passivation layer that is disposed in the first chip body portion and surrounds the first chip rear bump,
wherein the first chip passivation layer includes an inorganic material.

7. The semiconductor package of claim 6, further comprising a polymer adhesion layer surrounding the second chip front bump,
wherein a bonding surface of the second chip front bump and the solder layer is substantially the same plane as a bonding surface of the polymer adhesion layer and the first chip passivation layer.

8. The semiconductor package of claim 6, wherein the first chip passivation layer comprises any one selected from silicon oxide, silicon nitride, and silicon oxynitride.

9. The semiconductor package of claim 2, wherein the polymer adhesion layer comprises a non-conductive film (NCF).

10. A semiconductor package comprising:
a base member;
a first semiconductor chip disposed on the base member; and
a second semiconductor chip disposed on the first semiconductor chip,
wherein the first semiconductor chip comprises:
a first chip body portion including a front surface and a rear surface; and
a first chip rear bump disposed in a recessed region recessed into the first chip body portion from the rear surface,
wherein the second semiconductor chip comprises:
a second chip body portion including a front surface and a rear surface; and
a second chip front bump protruding from the front surface of the second chip body portion,
wherein the first chip rear bump comprises a lower metal layer and a solder layer disposed on the lower metal layer,
the solder layer of the first semiconductor chip and the second chip front bump of the second semiconductor chip are bonded to each other, and
the second chip front bump is disposed to cover at least the solder layer on a bonding surface of the second chip front bump and the solder layer,
wherein the semiconductor package further comprises a polymer adhesion layer that is disposed between the rear surface of the first chip body portion and the front surface of the second chip body portion,
wherein the solder layer is spaced apart from the polymer adhesion layer.

11. The semiconductor package of claim 10, wherein the first semiconductor chip further comprises:
a trench pattern formed in the recessed region; and
a barrier layer disposed along an inner surface of the trench pattern,
wherein the lower metal layer is disposed on a portion of the barrier layer corresponding to a bottom of the trench pattern, and
the solder layer is disposed on the lower metal layer.

12. The semiconductor package of claim 10, wherein the base member comprises one of an interposer and a printed circuit board.

13. The semiconductor package of claim 10, wherein the polymer adhesion layer surrounds the second chip front bump.

14. The semiconductor package of claim 13, wherein the polymer adhesion layer comprises a non-conductive film (NCF).

15. The semiconductor package of claim 10, further comprising a first chip passivation layer that is disposed in the first chip body portion and surrounds the first chip rear bump,
wherein the first chip passivation layer comprises an inorganic material.

16. The semiconductor package of claim 15, wherein the first chip passivation layer comprises any one selected from silicon oxide, silicon nitride, and silicon oxynitride.

17. The semiconductor package of claim 15,
wherein a bonding surface of the second chip front bump and the solder layer is substantially the same plane as a bonding surface of the polymer adhesion layer and the first chip passivation layer.

18. The semiconductor package of claim 10, further comprising:
a first chip through via penetrating the first chip body portion to be electrically connected to the first chip rear bump, and
a second chip through via penetrating the second chip body portion to be electrically connected to the second chip front bump.

* * * * *